United States Patent

De Lange

[11] Patent Number: 5,862,085
[45] Date of Patent: Jan. 19, 1999

[54] APPARATUS AND METHOD FOR DIFFERENTIAL COMPARISON OF DIGITAL WORDS

[75] Inventor: Willem De Lange, Los Altos, Calif.

[73] Assignee: Sun Microsystems, Inc., Mountain View, Calif.

[21] Appl. No.: 882,510

[22] Filed: Jun. 25, 1997

[51] Int. Cl.$^6$ .................................................. G11C 7/00
[52] U.S. Cl. ............................ 365/189.07; 365/189.11; 365/191; 365/203; 365/207
[58] Field of Search .............................. 365/189.07, 203, 365/207, 191, 189.11

[56] References Cited

U.S. PATENT DOCUMENTS

| | | | |
|---|---|---|---|
| 5,550,774 | 8/1996 | Brauer et al. | 365/189.07 |
| 5,572,467 | 11/1996 | Ghasser et al. | 365/189.07 |
| 5,621,677 | 4/1997 | Jones | 365/189.07 |

*Primary Examiner*—Do Hyun Yoo
*Attorney, Agent, or Firm*—William S. Galliani; Flehr Hohbach Test Albritton & Herbert LLP

[57] ABSTRACT

A circuit for comparing a first digital word to a second digital word includes a precharge circuit to generate an initial match signal, an initial inverse match signal, and a virtual ground signal in response to an input clock signal and an inverse input clock signal. Each comparison circuit of a set of comparison circuits generates a computed match signal and a computed inverse match signal based upon a selected bit of the first digital word and a corresponding selected bit of the second digital word. A signal differential sensing circuit derives a match signal for the first digital word and the second digital word based upon the virtual ground signal, the input clock signal, the computed match signal, and the computed inverse match signal.

17 Claims, 6 Drawing Sheets

APPARATUS AND METHOD FOR DIFFERENTIAL COMPARISON OF DIGITAL WORDS

BRIEF DESCRIPTION OF THE INVENTION

This invention relates generally to computer cache memories and other digital devices that compare digital words to determine whether they are equivalent. More particularly, this invention relates to a digital word comparator implemented with differential dynamic logic.

BACKGROUND OF THE INVENTION

A digital value or bit has one of two states—zero or one. A digital word is a sequence of digital values or bits. By way of example, a 16 bit digital word may look as follows: 0100111001010110. Computers operate by processing digital words. It is frequently necessary for a computer to compare two digital words to determine whether they are identical. For example, this operation is necessary when processing addresses of a computer program. A digital word comparator is used in this situation to determine whether a specified address in a computer program matches an address at a cache memory location.

Since the operation of comparing digital words is so prevalent in a computer, it is important to perform it efficiently. The comparison of two digital words must identify whether each bit in a first digital word is identical to a corresponding bit in a second digital word. Thus, if the two bits have identical values (they are both zero or they are both one) then a match exists, as indicated by a low digital value. If a match does not exist (one bit is zero and the other bit is one or one bit is one and the other bit is zero) then the comparison operation fails, as indicated by a digital high value. The foregoing logical processing can be characterized as an exclusive-or operation. This processing can be summarized as follows:

"EXCLUSIVE-OR" TRUTH TABLE
FOR A COMPARISON OPERATION

| VALID BIT 1 | VALID BIT 2 | OUTPUT |
|---|---|---|
| 0 | 0 | 0 |
| 0 | 1 | 1 |
| 1 | 0 | 1 |
| 1 | 1 | 0 |

For a match to exist between two digital words, all comparison operations between corresponding bits of the two digital words must be satisfied. In other words, a logical one value must be produced by all of the comparison operations. If this occurs, then a match hit signal is generated, otherwise a match miss signal is generated.

In view of the fundamental and widespread role of comparators in computer systems, it is advantageous to improve their performance. In particular, it is advantageous to design a fast comparator that is easy to layout, that is easy to control, and that is immune from process variations.

SUMMARY OF THE INVENTION

A circuit for comparing a first digital word to a second digital word includes a precharge circuit to generate an initial match signal, an initial inverse match signal, and a virtual ground signal in response to an input clock signal and an inverse input clock signal. Each comparison circuit of a set of comparison circuits generates a computed match signal and a computed inverse match signal based upon a selected bit of the first digital word and a corresponding selected bit of the second digital word. A signal differential sensing circuit derives a match signal for the first digital word and the second digital word based upon the virtual ground signal, the input clock signal, the computed match signal, and the computed inverse match signal. The virtual ground signal is used to enable the signal differential sensing circuit only when the computed match signal and the computed inverse match signal are each at an adequate signal level for reliable differential sensing.

The circuit of the invention is very fast. In addition, it is easy to control and it's physical topology is relatively easy to implement in a silicon chip. The use of the virtual ground signal as described herein makes the design immune from process variations.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
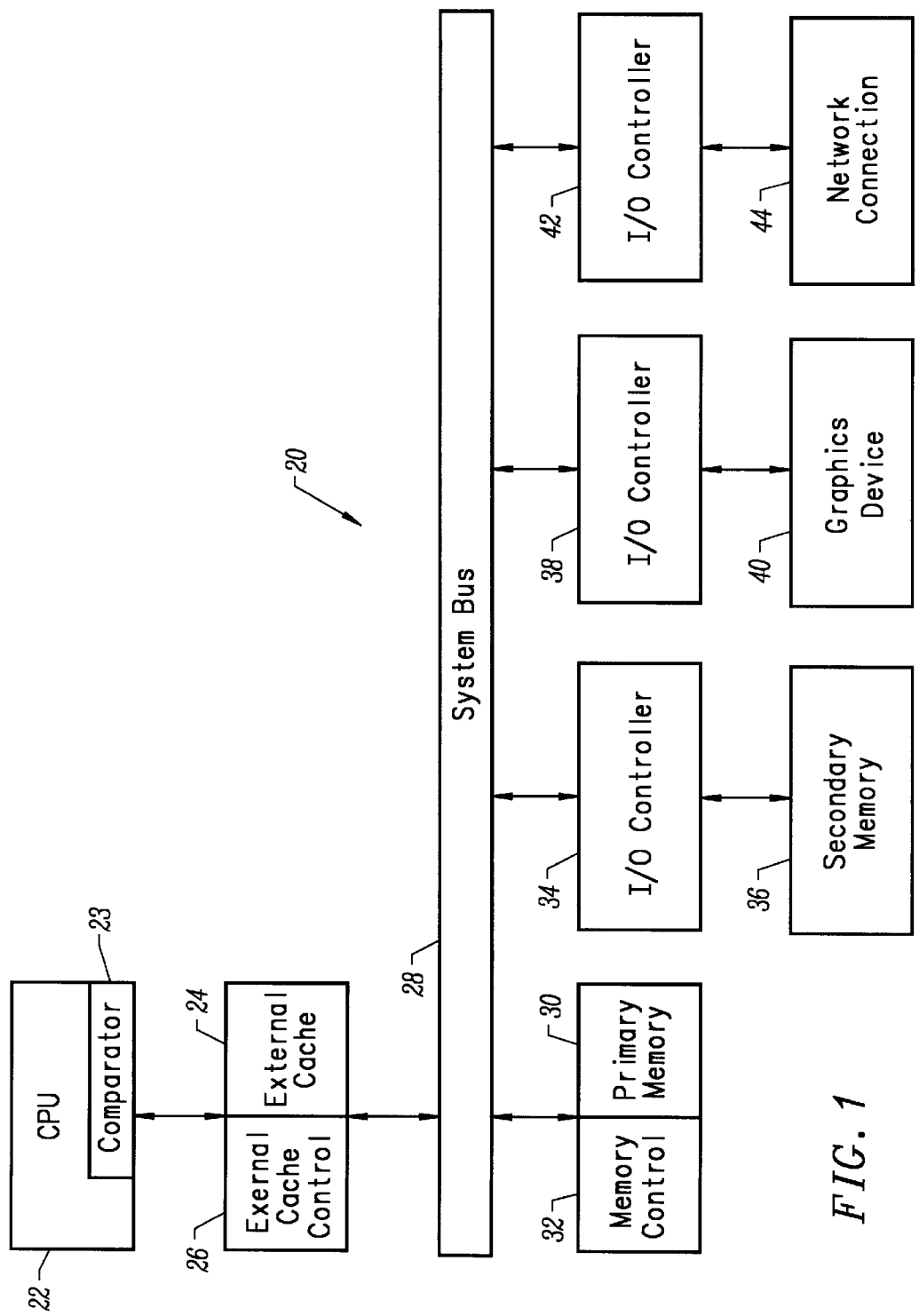
FIG. 1 illustrates a general purpose computer incorporating the digital word comparator of the invention.

FIG. 1 illustrates a general purpose computer 20 incorporating the digital word comparator of the invention. The digital word comparator of the invention may be implemented in any number of the devices shown in FIG. 1.

FIG. 1 includes a central processing unit 22, which includes the digital word comparator 23 of the invention. By way of example, the digital word comparator 23 may be used in one or more of the internal caches, translation lookaside buffers, and other buffers of the CPU 22.

As known in the art, the CPU 22 executes instructions of a computer program. Each instruction is located at a memory address. Similarly, the data associated with an instruction is located at a memory address. The CPU 22 accesses the specified memory address to fetch the instruction or data stored there.

Most CPUs include an on-board memory called an internal cache. The internal cache stores a set of memory addresses and the instructions or data associated with the memory addresses. A digital word comparator is used to identify whether a required memory address exists in the internal cache.

If a specified address is not in the internal, or L1 cache, then the CPU 22 looks for the specified address in an external cache, also called an L2 cache 24. The external cache 24 has an associated external cache controller 26. The external cache controller 26 may also use the digital word comparator of the invention.

If the address is not in the external cache 24 (a cache miss), then the external cache controller 26 requests access to a system bus 28. When the system bus 28 becomes available, the external cache controller 26 is allowed to route its address request to the primary memory 30. The primary memory 30 has an associated memory controller 32. The memory controller 32 queries the primary memory 30 for the subject address. If the subject address exists in primary memory 30, the data output from the primary memory 30 is applied to the system bus 28. It is then stored in the external cache 24 and is passed to the CPU 22 for processing.

The foregoing processing must be performed for every address request. Indeed, if the address request is not found in primary memory 30, similar processing is performed by an input/output controller 34 associated with the secondary memory 36.

As shown in FIG. 1, there are additional devices connected to the system bus 28. For example, FIG. 1 illustrates an input/output controller 38 operating as an interface between a graphics device 40 and the system bus 28. In addition, the figure illustrates an input/output controller 42 operating as an interface between a network connection circuit 44 and the system bus 28.

The digital word comparator of the invention finds its largest applicability in the internal cache of the CPU 22 and the external cache controller 26 of the external cache 24. However, the digital word comparator of the invention can be incorporated into any of the devices of FIG. 1, if required.

Figure 2:
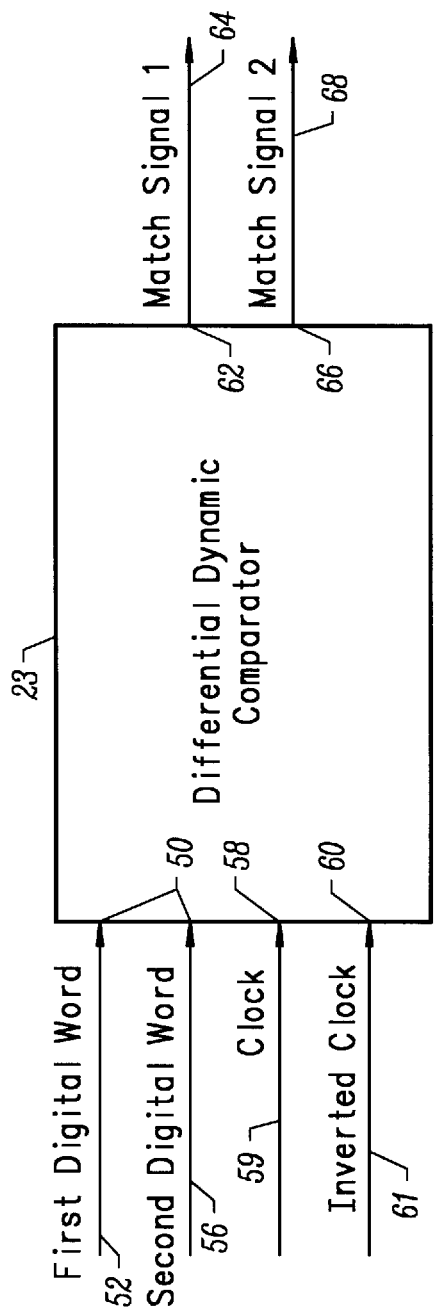
FIG. 2 is a general illustration of the inputs and outputs of a digital word comparator in accordance with an embodiment of the invention.

FIG. 2 is a general illustration of a digital word comparator 23 in accordance with the invention. The digital word comparator includes input nodes 50 that are used to receive a first digital word from a bus 52 and a second digital word from a bus 56. The comparator 23 also includes a clock input node 58 to receive a clock signal from line 59, and a clock input node 60 to receive an inverted (or inverse) clock signal from line 61. The comparator 23 also includes an output node 62 for applying a match signal (hit or miss) on line 64. Finally, the comparator 23 includes an output node 66 for applying a high-load match miss signal (hit or miss) on line 68.

Figure 3:
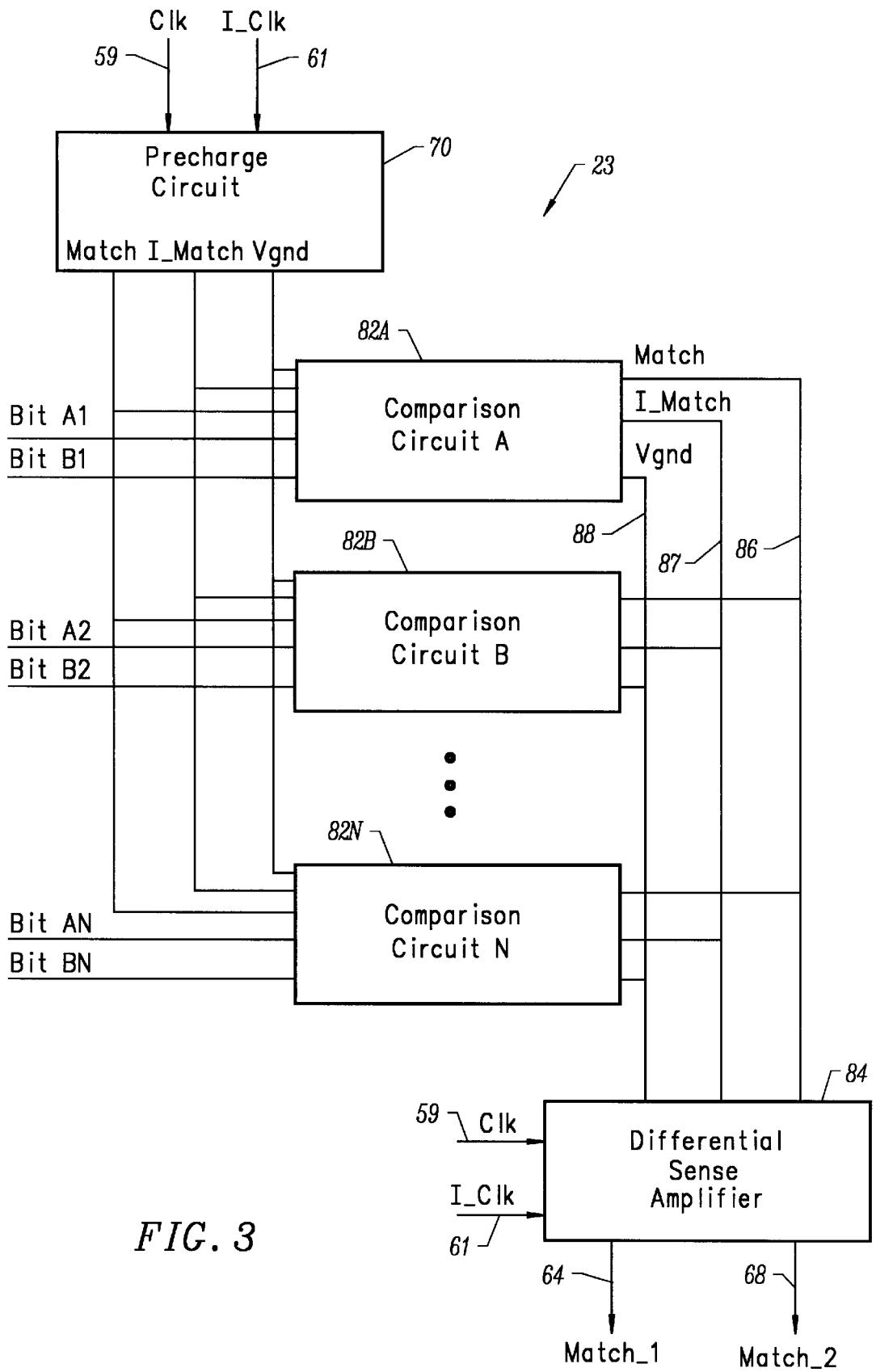
FIG. 3 is a general illustration of the circuit components used to construct the digital word comparator of FIG. 2.

FIG. 3 is a more detailed illustration of the digital word comparator 23 of FIG. 2. The digital word comparator 23 includes a precharge circuit 70, a set of comparison circuits 82A–82N, and a differential sense amplifier 84. The precharge circuit 70 uses the input clock from line 59 and the inverted input clock from line 61 to generate the following output signals: an initial match signal, an initial inverse match signal, and a virtual ground signal. Each of the output signals from the precharge circuit 70 are routed to each comparison circuit 82 of the set of comparision circuits 82A–82N.

Each comparision circuit 82 also receives a selected bit from a first digital word and a corresponding selected bit from a second digital word. For example, comparison circuit 82A receives a bit A1 signal from a first digital word and a bit B1 signal from a second digital word. Each comparision circuit performs a logical exclusive-OR operation on its input digital word bits and produces a computed match signal, a computed inverse match signal, and a virtual ground signal. Observe that the outputs of each of the comparison circuits are connected to one another. For example, all of the computed match signal outputs are connected together by a line 86, all of the computed inverse match signal outputs are connected together by a line 87, and all of the virtual ground signals are connected together by a line 88. This configuration may be thought of as a "wired logical OR". Thus, for example, if any computed match signal from a comparision circuit is a digital high value, then the signal on the wire 86 will be a digital high value.

The computed match signal on line 86, the computed inverse match signal on line 87, and the virtual ground signal on line 88 are applied to the differential sense amplifier 84. The differential sense amplifier 84 also receives the clock signal and the inverted clock signal. The differential sense amplifier 84 performs a differential comparison of the computed match signal and the computed inverse match signal to quickly generate an output match signal (match_1). Preferably, the circuit 84 also generates a high-load match signal (match_2). As described below, the operation of the differential sense amplifier 84 is enabled by a current control circuit that is responsive to the virtual ground signal, the clock signal, and the inverted clock signal.

The main components of the differential dynamic comparator 23 have now been described. In addition, the general function of each of those components has been described. The operation of these components will be more fully appreciated with reference to FIGS. 4–6, which illustrate embodiments of the components.

Figure 4:
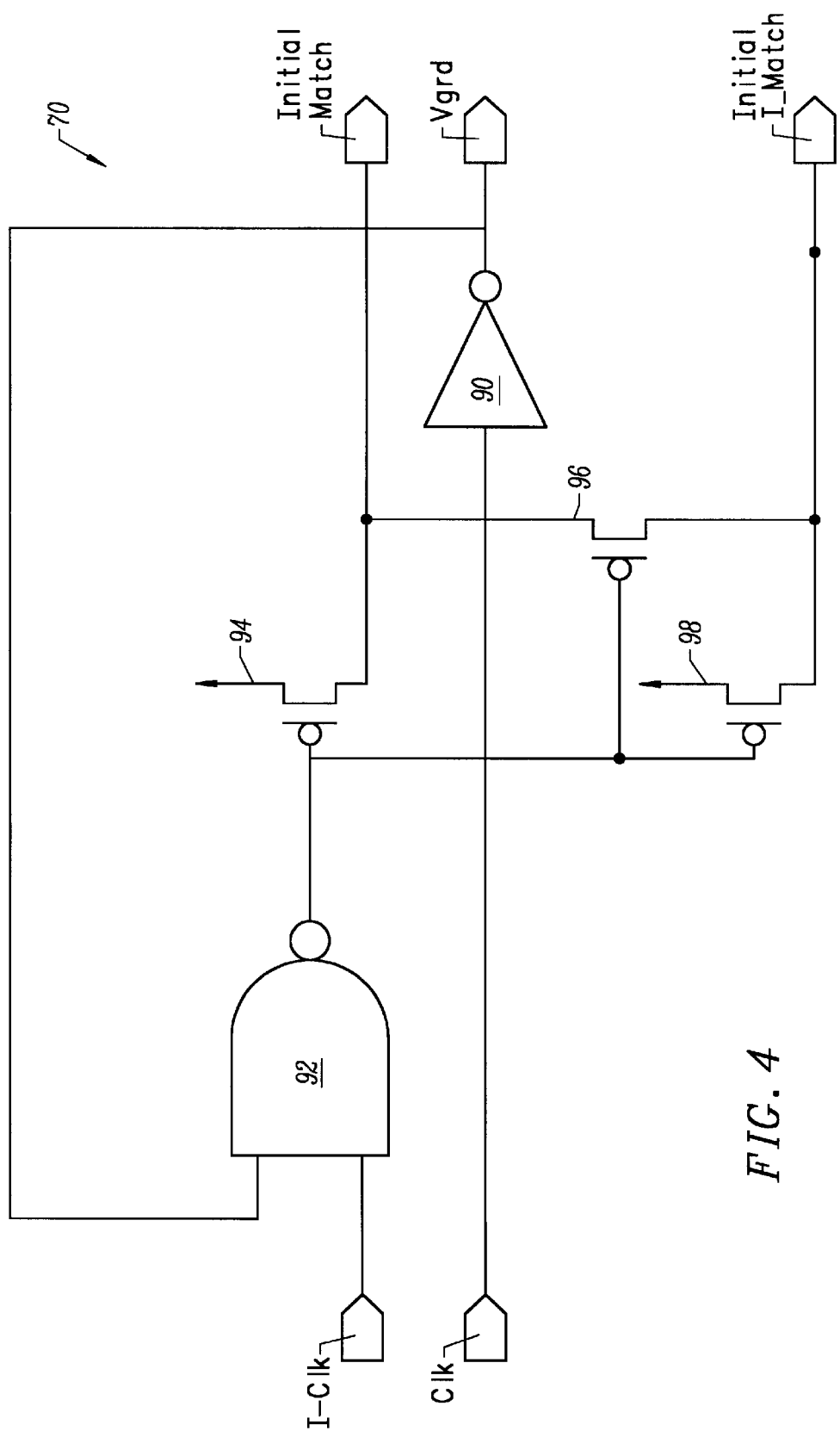
FIG. 4 illustrates a precharge circuit that may be used in a digital word comparator constructed in accordance with an embodiment of the invention.

FIG. 4 illustrates a precharge circuit 70 which may be used in accordance with an embodiment of the invention. The precharge circuit 70 functions to produce digital high signals for the initial match signal, the initial inverse match signal, and the virtual ground signal during the dynamic logic precharge cycle. That is, the precharge circuit 70 produces a set of digital high output signals when the clock signal is at a digital low value (and the inverted clock signal is at a digital high value). This functionality may be achieved in any number of ways in accordance with the invention. FIG. 4 illustrates one technique to obtain this functionality.

The circuit of FIG. 4 uses a first logic circuit in the form of an inverter 90 to generate a digital high virtual ground signal from the digital low input clock signal. The remaining components in FIG. 4 may be considered a second logic circuit to generate the initial match signal and the initial inverse match signal.

The digital high virtual ground signal is routed back to the NAND gate 92. The other input node to the NAND gate 92 is a digital high inverted clock signal, thus the output of the NAND gate 92 is a digital low signal, which turns-on PMOS transistors 94, 96, and 98. PMOS transistors 94 and 98 drive digital high signals on the match output node and the inverse match output node. In other words, at this time, both the initial match signal and the initial inverse match signal have digital high values. The PMOS transistor 96 operates to equalize the levels of the initial match signal and the initial inverse match signal. The NAND gate 92 operates to shut-off the precharge through the transistors 94 and 98 at the end of the precharge phase so that cross-bar currents do not occur.

Figure 5:
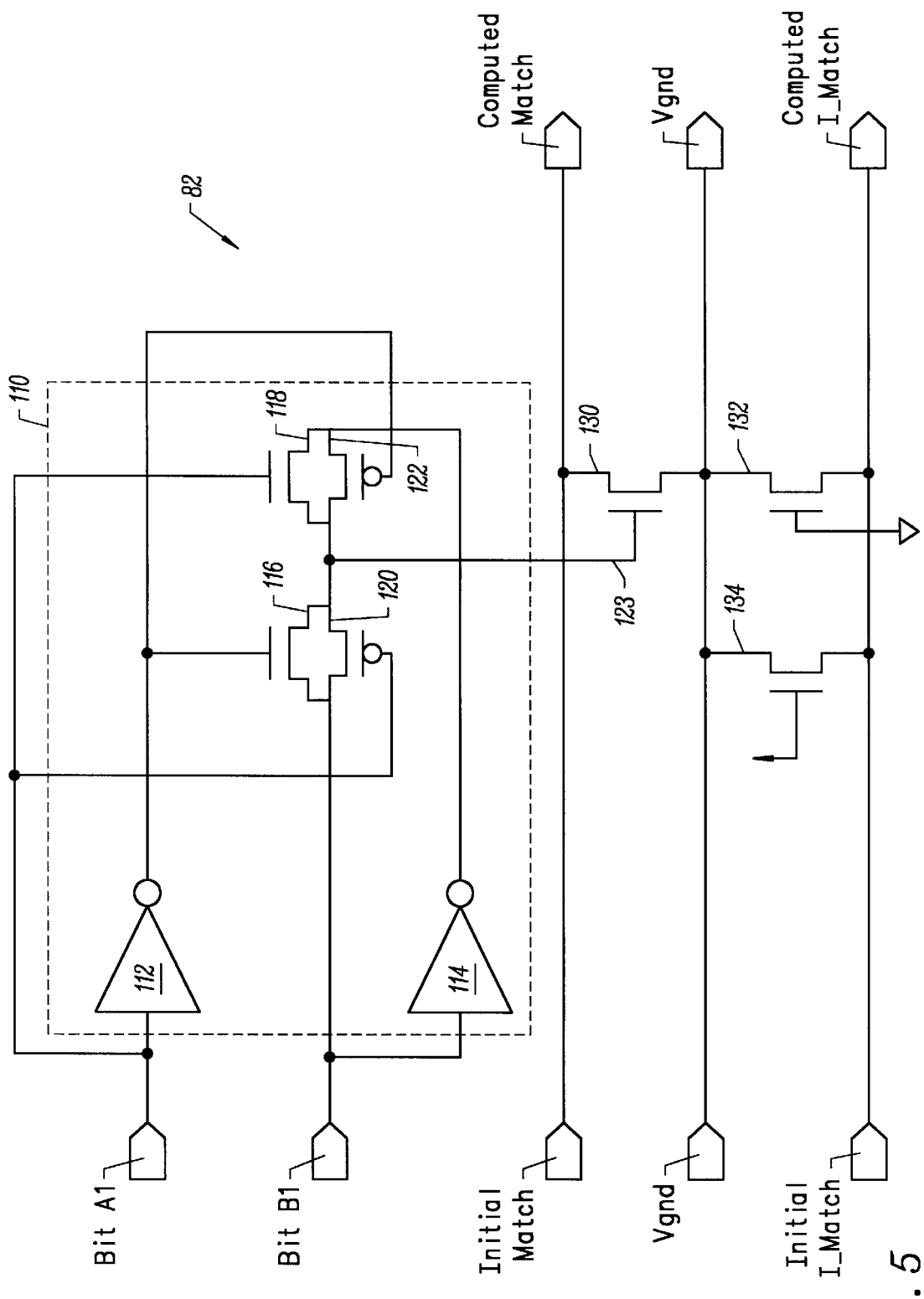
FIG. 5 illustrates a comparison circuit that may be used in a digital word comparator constructed in accordance with an embodiment of the invention.

FIG. 5 illustrates a comparison circuit 82 which may be used in accordance with an embodiment of the invention. As indicated above, the comparision circuit 82 performs a logical exclusive-or operation on corresponding input bits from two digital words. If the two bits match, then a computed match signal with a digital high value is produced and a computed inverse match signal with a digital low value is produced. This function is performed during the dynamic logic evaluation phase when the input clock has a digital high value. Thus, the virtual ground signal at this time will have a digital low value because it was inverted by the precharge circuit 70. This functionality of the comparision circuit 82 may be achieved in any number of ways. FIG. 5 illustrates one circuit that may be used in accordance with the invention.

FIG. 5 illustrates an exclusive-or logical circuit 110 including inverters 112 and 114, NMOS transistors 116 and 118, and PMOS transistors 120 and 122. When there is a match between the input bits (both input bits have a digital high value or both input bits have a digital low value) then the output node 123 of the exclusive-or logical circuit 110 has a digital low value. Thus, pull-up transistor 130 is off. Recall that the initial match signal is in a digital high state. Since the transistor 130 is off, the match signal remains in a digital high state and leaves the comparision circuit as a computed match signal with a digital high state.

Also recall that during evaluation, the virtual ground signal is in a digital low state. Since pull-up transistor 134 is tied to Vdd and is always on, the inverse match signal will be discharged and approximate the digital low value of the virtual ground signal. As a result, the comparision circuit 82 produces a digital low inverse match signal in the case of a match between two input bits.

When the two input bits do not match, the signal on node 123 has a digital high value. As a result, pull-down transistor 130 is turned-on to pull the digital high initial match signal low. Thus, a digital low computed match signal results. When turned-on, the current through pull-down transistor 130 is larger than the current through transistor 134 to produce a digital high computed inverse match signal. Preferably, pull-up transistor 134 is sized to be approximately ½ to ⅓ the size of pull-down transistor 130 in order to implement the desired current ratio. Transistor 132 may be provided to equalize source and drain parasitic loads to that of transistor 130.

Figure 6:
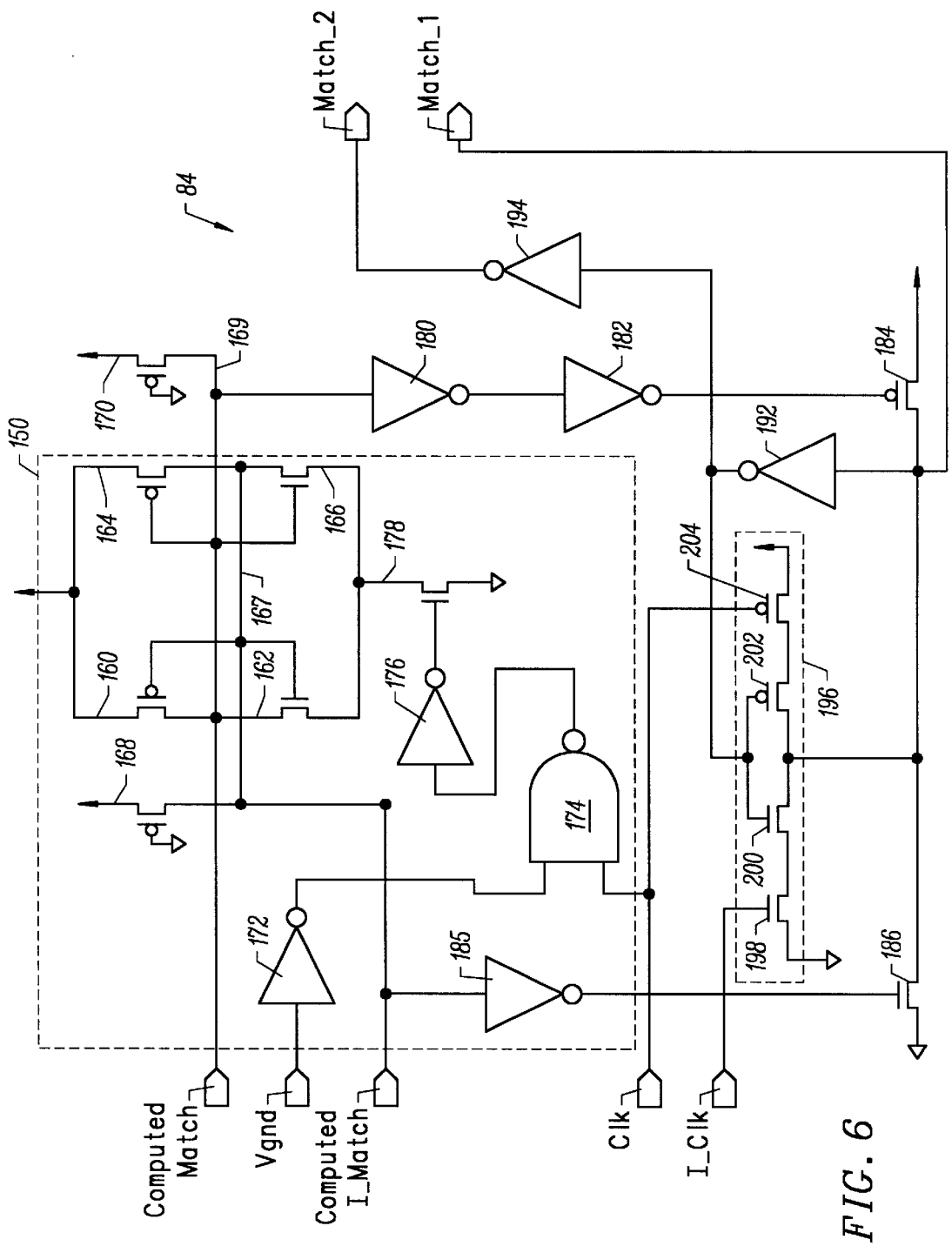
FIG. 6 illustrates a signal differential sensing circuit that may be used in a digital word comparator constructed in accordance with an embodiment of the invention.

FIG. 6 illustrates a differential sense amplifier 84 in accordance with an embodiment of the invention. The differential sense amplifier 84 includes a sense amplifier 150 comprising series connected PMOS transistor 160 and NMOS transistor 162 with an opposite and symmetrical series connected PMOS transistor 164 and NMOS transistor 166. As indicated above, during precharge the initial match signal and the initial inverse match signal each have a digital high value. Thus, it can be appreciated that the differential sense amplifier 84 will be charged to a digital high state during precharge. Transistors 168 and 170 are high-resistance leaker devices with long channels to insure that the differential sense amplifier 84 is kept at a full digital high (Vdd) value prior to evaluation (during precharge) and also during evaluation in the case where signal node 169 has to remain high. Recall that the virtual ground signal has a digital high value during precharge. This signal is processed by a current control circuit comprising inverter 172, NAND gate 174, inverter 176, and current control transistor 178. Since the virtual ground signal has a digital high value during precharge, the inverter 172 generates a digital low signal, thus the output of the NAND gate 174 will be a digital high value, regardless of the value at its other input node. The digital high value is inverted into a digital low value by inverter 176. As a result, current control transistor 178 is off. Thus, the sense amplifier maintains its digital high state.

Differential sensing by the signal differential sensing circuit is controlled by the current control circuit (172, 174, 176, 178). The clock signal is high during evaluation, thus the virtual ground signal is low. Therefore, the output of inverter 172 is a digital high value. The NAND gate 174 also receives a digital high value from the clock signal, thus its output signal is a digital low value. The inverter 176 then generates a digital high signal to turn on current control transistor 178. This allows differential sensing to commence. Observe that the virtual ground signal tracks the precharge condition. The virtual ground signal is used as a conditioning signal indicating when evaluation starts. The inverter 172, NAND gate 174, and inverter 176 provide delay so that sensing does not commence until the computed match signal and the computed inverse match signal reach an adequate signal level for differential sensing. This feature makes the circuit insensitive to process variations. Also note that the match and inverse match signal will experience similar delays, with the result that the circuit is insensitive to process variations. In view of these features, the circuit of the invention can be operated with minimal safety margins.

The NAND gate 174 operates to quickly shut-off the sense amp at the initiation of the precharge phase. This avoids cross-bar currents through the sense amp during precharge.

When the inverse computed match signal has a digital low value, transistor 160 is turned-on and transistor 162 is turned-off, thus node 169 has a digital high value. (Note that a digital high computed match signal will be processed at the same time. This digital high signal keeps transistor 164 off and turns-on transistor 166, however transistor 166 is tied to node 167, not node 169, and therefore does not directly control the value on node 169.)

The resultant high signal on node 169 is inverted twice by inverters 180 and 182, with the result that PMOS transistor 184 sees a digital high signal and turns-off. Simultaneously, the inverse computed match signal is inverted by the inverter 185 to produce a digital high signal to turn-on transistor 186. Thus, node 190 is pulled low and a digital low match signal is quickly generated at output node match_1. This digital low match signal is also driven through inverters 192 and 194 to produce a high-load match signal. As its name implies, this stronger signal is suitable for driving a high-load, if the high load can tolerate the signal delay associated with the inverters 192 and 194.

When the inverse computed match signal has a digital high value, the high value is inverted by inverter 185 to turn-off transistor 186. The digital high value causes transistor 160 to turn-off while transistor 162 turns-on, which pulls-down node 169. (Note that a digital low computed match signal will be processed at the same time. This digital low signal turns-on transistor 164 and turns-off transistor 166. Observe again that transistor 164 is tied to node 167, not node 169, and therefore does not directly control the value at node 169).

The resultant digital low value on node 169 is inverted twice by inverters 180 and 182 to turn-on transistor 184. This results in a digital high match signal being driven to the output node match_1. It also results in a digital high high-load match signal at node match_2.

The differential sense amplifier 84 may also include a latch 196, including two NMOS transistors 198, 200, and two PMOS transistors 202, 204. The latch operates to keep data during the precharge phase in order to isolate the precharge from the signal flow.

Those skilled in the art will appreciate that the disclosed embodiments of FIGS. 4–6 are relatively easy to layout in silicon. In addition, the circuit is relatively easy to control.

Alternate embodiments of the invention will be readily cognizable to those skilled in the art. For example, the output of NAND gate 92 of FIG. 4 may be connected to the gate of transistor 134 of FIG. 5 so that transistor 134 is only on during the evaluation phase. The output of the exclusive-OR logical operation at node 123 can be inverted and then combined with another logical condition, such as a valid or ready bit, at a logical AND gate.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

I claim:

1. A circuit for comparing a first digital word to a second digital word, comprising:

a precharge circuit to generate an initial match signal, an initial inverse match signal, and a virtual ground signal in response to an input clock signal and an inverse input clock signal;

a set of comparison circuits, each comparison circuit of said set of comparison circuits generating a computed match signal and a computed inverse match signal based upon a selected bit of said first digital word and a corresponding selected bit of said second digital word; and a signal differential sensing circuit to derive a match signal for said first digital word and said second digital word based upon said virtual ground signal, said input clock signal, said computed match signal, and said computed inverse match signal.

2. The circuit of claim 1, wherein said precharge circuit includes:

a first logic circuit to generate said virtual ground signal from said input clock signal; and a second logic circuit to generate said initial match signal and said initial inverse match signal from said inverse input clock signal.

3. The circuit of claim 1, wherein said comparison circuit includes:

an exclusive-or logical circuit to generate an exclusive-or output signal from said selected bit of said first digital word and said corresponding selected bit of said second digital word.

4. The circuit of claim 3, wherein said comparison circuit includes:

a pull-down circuit to generate said computed match signal from said initial match signal and said exclusive-or output signal.

5. The circuit of claim 4, wherein said comparison circuit includes:

a pull-up circuit to generate said computed inverse match signal from said initial match signal and said exclusive-or output signal.

6. The circuit of claim 1, wherein said signal differential sensing circuit comprises a sense amplifier to derive said match signal from said virtual ground signal, said input clock signal, said computed match signal, and said computed inverse match signal.

7. The circuit of claim 6, wherein said signal differential sensing circuit comprises a current control circuit responsive to said input clock signal and said virtual ground signal to control said sense amplifier such that said sense amplifier only operates when said computed match signal and said computed inverse match signal are each at an adequate signal level for differential sensing.

8. The circuit of claim 1, wherein said signal differential sensing circuit derives a high-load match signal after said match signal is derived.

9. The circuit of claim 1, wherein the circuit is embedded in a central processing unit of a computer.

10. The circuit of claim 1, wherein the circuit is embedded in a cache memory of a computer.

11. The circuit of claim 9, further comprising a system bus connected to said central processing unit, said system bus including connections to a primary memory and a plurality of input/output controllers.

12. A method of comparing a first digital word to a second digital word, said method comprising the steps of:

controlling a computed match signal on a match signal line and a computed inverse match signal on an inverse match signal line with a set of comparison circuits that compare selected bits of said first digital word to corresponding selected bits of said second digital word;

selectively enabling a signal differential sensing circuit with a clock signal and a virtual ground signal; and deriving a match signal from said signal differential sensing circuit's processing of said computed match signal and said computed inverse match signal.

13. The method of claim 12, wherein said controlling step includes the step of performing exclusive-or logical operations between said selected bits of said first digital word and said corresponding selected bits of said second digital word.

14. The method of claim 12, wherein said enabling step includes the step of enabling said signal differential sensing circuit only when said computed match signal and said computed inverse match signal attain a predetermined signal level.

15. The method of claim 12, wherein said deriving step includes the step of deriving a high-load match signal after said match signal is derived.

16. The method of claim 12, further comprising the step of processing said match signal within a central processing unit.

17. The method of claim 12, further comprising the step of processing said match signal within a cache memory.

* * * * *